(12) United States Patent
Manning

(10) Patent No.: US 7,517,753 B2
(45) Date of Patent: Apr. 14, 2009

(54) METHODS OF FORMING PLURALITIES OF CAPACITORS

(75) Inventor: H. Montgomery Manning, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/131,552

(22) Filed: May 18, 2005

(65) Prior Publication Data

US 2006/0263968 A1    Nov. 23, 2006

(51) Int. Cl.
*H01L 21/00* (2006.01)

(52) U.S. Cl. .................. 438/253; 438/255; 438/272; 438/396; 438/397; 257/E21.008; 257/E21.014; 257/E21.647; 257/E21.648; 257/E21.658; 257/E27.086; 257/E27.087

(58) Field of Classification Search ............ 438/238, 438/253, 387, 396, 244, 597, 633; 257/E21.165, 257/E21.008, E21.648, E27.089, E21.014, 257/647, 655, 657, 658, 664, E27.086, 87
See application file for complete search history.

(56) References Cited

U.S. PATENT DOCUMENTS

| | | | |
|---|---|---|---|
| 4,517,729 A | 5/1985 | Batra | |
| 5,236,860 A | 8/1993 | Fazan et al. | |
| 5,340,763 A | 8/1994 | Dennison | |
| 5,401,681 A | 3/1995 | Dennison | |
| 5,467,305 A | 11/1995 | Bertin et al. | |
| 5,498,562 A | 3/1996 | Dennison et al. | |
| 5,532,089 A | 7/1996 | Adair et al. | |
| 5,604,696 A | 2/1997 | Takaishi | |
| 5,605,857 A | 2/1997 | Jost et al. | |
| 5,652,164 A | 7/1997 | Dennison et al. | |
| 5,654,222 A | 8/1997 | Sandhu et al. | |
| 5,686,747 A | 11/1997 | Jost et al. | |
| 5,702,990 A | 12/1997 | Jost et al. | |
| 5,705,838 A | 1/1998 | Jost et al. | |
| 5,767,561 A | 6/1998 | Frei et al. | |
| 5,821,140 A | 10/1998 | Jost et al. | |
| 5,869,382 A | 2/1999 | Kubota | |
| 5,900,660 A | 5/1999 | Jost et al. | |
| 5,955,758 A | 9/1999 | Sandhu et al. | |
| 5,981,350 A | 11/1999 | Geusic et al. | |

(Continued)

FOREIGN PATENT DOCUMENTS

DE    4447804    1/2002

(Continued)

OTHER PUBLICATIONS

U.S. Appl. No. 10/894,633, filed Jul. 2004, Manning.

(Continued)

*Primary Examiner*—Michael S Lebentritt
(74) *Attorney, Agent, or Firm*—Wells St. John P.S.

(57) ABSTRACT

The invention includes methods of forming pluralities of capacitors. In one implementation, a method of forming a plurality of capacitors includes anodically etching individual capacitor electrode channels within a material over individual capacitor storage node locations on a substrate. The channels are at least partially filled with electrically conductive capacitor electrode material in electrical connection with the individual capacitor storage node locations. The capacitor electrode material is incorporated into a plurality of capacitors. Other aspects and implementations are contemplated.

43 Claims, 17 Drawing Sheets

U.S. PATENT DOCUMENTS

| | | | |
|---|---|---|---|
| 5,990,021 A | 11/1999 | Prall et al. | |
| 6,037,212 A | 3/2000 | Chao | |
| 6,037,218 A | 3/2000 | Dennison et al. | |
| 6,059,553 A | 5/2000 | Jin et al. | |
| 6,090,700 A | 7/2000 | Tseng | |
| 6,108,191 A * | 8/2000 | Bruchhaus et al. | 361/306.3 |
| 6,110,774 A | 8/2000 | Jost et al. | |
| 6,133,620 A * | 10/2000 | Uochi | 257/649 |
| 6,180,450 B1 | 1/2001 | Dennison | |
| 6,204,143 B1 | 3/2001 | Roberts et al. | |
| 6,204,178 B1 | 3/2001 | Marsh | |
| 6,258,650 B1 * | 7/2001 | Sunouchi | 438/238 |
| 6,274,497 B1 | 8/2001 | Lou | |
| 6,303,518 B1 | 10/2001 | Tian et al. | |
| 6,303,956 B1 | 10/2001 | Sandhu et al. | |
| 6,323,528 B1 * | 11/2001 | Yamazaki et al. | 257/411 |
| 6,331,461 B1 * | 12/2001 | Juengling | 438/253 |
| 6,372,554 B1 | 4/2002 | Kawakita et al. | |
| 6,383,861 B1 | 5/2002 | Gonzalez et al. | |
| 6,399,490 B1 | 6/2002 | Jammy et al. | |
| 6,403,442 B1 | 6/2002 | Reinberg | |
| 6,432,472 B1 | 8/2002 | Farrell et al. | |
| 6,458,653 B1 | 10/2002 | Jang | |
| 6,458,925 B1 | 10/2002 | Fasano | |
| 6,459,138 B2 | 10/2002 | Reinberg | |
| 6,617,222 B1 | 9/2003 | Coursey | |
| 6,645,869 B1 | 11/2003 | Chu et al. | |
| 6,656,748 B2 | 12/2003 | Hall et al. | |
| 6,667,502 B1 * | 12/2003 | Agarwal et al. | 257/296 |
| 6,673,693 B2 | 1/2004 | Kirchhoff | |
| 6,709,978 B2 | 3/2004 | Geusic et al. | |
| 6,720,232 B1 | 4/2004 | Tu et al. | |
| 6,767,789 B1 | 7/2004 | Bronner et al. | |
| 6,784,112 B2 | 8/2004 | Arita et al. | |
| 6,812,513 B2 | 11/2004 | Geusic et al. | |
| 6,822,261 B2 * | 11/2004 | Yamazaki et al. | 257/59 |
| 6,844,230 B2 | 1/2005 | Reinberg | |
| 6,849,496 B2 | 2/2005 | Jaiprakash et al. | |
| 6,893,914 B2 | 5/2005 | Kim et al. | |
| 6,897,109 B2 | 5/2005 | Jin et al. | |
| 6,927,122 B2 | 8/2005 | Geusic et al. | |
| 6,930,640 B2 | 8/2005 | Chung et al. | |
| 7,042,040 B2 * | 5/2006 | Horiguchi | 257/301 |
| 7,064,365 B2 | 6/2006 | An et al. | |
| 7,073,969 B2 | 7/2006 | Kamm | |
| 7,074,669 B2 | 7/2006 | Iijima et al. | |
| 7,081,384 B2 | 7/2006 | Birner et al. | |
| 7,084,451 B2 | 8/2006 | Forbes et al. | |
| 7,125,781 B2 | 10/2006 | Manning et al. | |
| 7,160,788 B2 * | 1/2007 | Sandhu et al. | 438/424 |
| 7,179,706 B2 | 2/2007 | Patraw et al. | |
| 7,199,005 B2 * | 4/2007 | Sandhu et al. | 438/244 |
| 7,413,952 B2 | 8/2008 | Busch et al. | |
| 2001/0012223 A1 | 8/2001 | Kohyama | |
| 2001/0026974 A1 | 10/2001 | Reinberg | |
| 2001/0044181 A1 | 11/2001 | Nakamura | |
| 2002/0022339 A1 * | 2/2002 | Kirchhoff | 438/409 |
| 2002/0030221 A1 | 3/2002 | Sandhu et al. | |
| 2002/0039826 A1 | 4/2002 | Reingberg | |
| 2002/0086479 A1 | 7/2002 | Reinberg | |
| 2002/0090779 A1 | 7/2002 | Jang | |
| 2002/0098654 A1 | 7/2002 | Durcan et al. | |
| 2002/0153589 A1 | 10/2002 | Oh | |
| 2002/0153614 A1 | 10/2002 | Ema et al. | |
| 2002/0163026 A1 | 11/2002 | Park | |
| 2003/0085420 A1 | 5/2003 | Ito et al. | |
| 2003/0153146 A1 | 8/2003 | Won et al. | |
| 2003/0178684 A1 | 9/2003 | Nakamura | |
| 2003/0190782 A1 | 10/2003 | Ko et al. | |
| 2003/0227044 A1 * | 12/2003 | Park | 257/301 |
| 2004/0018679 A1 | 1/2004 | Yu et al. | |
| 2004/0056295 A1 | 3/2004 | Agarwal | |
| 2004/0150070 A1 | 8/2004 | Okada et al. | |
| 2004/0188738 A1 | 9/2004 | Farnworth et al. | |
| 2005/0051822 A1 | 3/2005 | Manning | |
| 2005/0054159 A1 | 3/2005 | Manning | |
| 2006/0024958 A1 | 2/2006 | Ali | |
| 2006/0046420 A1 | 3/2006 | Manning | |
| 2006/0051918 A1 | 3/2006 | Busch et al. | |
| 2006/0063344 A1 | 3/2006 | Manning et al. | |
| 2006/0063345 A1 | 3/2006 | Manning et al. | |
| 2006/0115951 A1 | 6/2006 | Mosley | |
| 2006/0121672 A1 | 6/2006 | Basceri et al. | |
| 2006/0148190 A1 | 7/2006 | Busch | |
| 2006/0186451 A1 | 8/2006 | Dusberg et al. | |
| 2006/0211211 A1 | 9/2006 | Sandhu et al. | |
| 2006/0249798 A1 | 11/2006 | Manning | |
| 2006/0261440 A1 | 11/2006 | Manning | |
| 2006/0263968 A1 | 11/2006 | Manning | |
| 2007/0032014 A1 | 2/2007 | Sandhu et al. | |
| 2007/0048976 A1 | 3/2007 | Raghu | |
| 2007/0093022 A1 | 4/2007 | Basceri | |
| 2007/0099328 A1 | 5/2007 | Chiang et al. | |
| 2007/0145009 A1 | 6/2007 | Fucsko et al. | |

FOREIGN PATENT DOCUMENTS

| | | |
|---|---|---|
| KR | 20010061020 | 7/2001 |
| KR | 20010114003 | 12/2001 |
| WO | 2004/027898 | 8/2004 |
| WO | 2004/040252 | 12/2004 |
| WO | WO 2005/024936 | 3/2005 |

OTHER PUBLICATIONS

U.S. Appl. No. 10/928,931, filed Aug. 2004, Busch et al.

U.S. Appl. No. 10/929,037, filed Aug. 2004, Manning.

U.S. Appl. No. 11/006,331, filed Dec. 2004, Basceri et al.

Kim, D.H. et al., *A Mechanically Enhanced Storage Node for Virtually Unlimited Height (MESH). Capacitor Aiming at Sub 70nm DRAMs*, IEEE Jan. 2004, pp. 69-72.

J. Banhart, *Aluminum Foams: On the Road to Real Applications*, MRS Bulletin, pp. 290-295 (Apr. 2003).

D. Crouse et al., *Self-Assembled Nanostructures Using Anodized Alumina Thin Films for Optoelectronic Applications*, IEEE, pp. 234-235 (1999).

L. J. Gibson et al., *Cellular Solids*, MRS Bulletin, pp. 270-274 (Apr. 2003).

D. J. Green et al., *Cellular Ceramics: Intriguing Structures, Novel Properties, and Innovative Applications*, MRS Bulletin, pp. 296-300 (Apr. 2003).

D. J. Green et al., *The Structure and Applications of Cellular Ceramics*, MRS Bulletin, 10 pages (Apr. 2003).

J.M. Karp et al., *Scaffolds for Tissue Engineering*, MRS Bulletin, pp. 301-302 (Apr. 2003).

V. V. Konovalov et al., *Chemistry of Materials*, Chem. Mater., vol. 11, No. 8, pp. 1949-1951 (Aug. 1999).

A. M. Kraynik, *Foam Structure: From Soap Froth to Solid Foams*, MRS Bulletin, pp. 275-278 (Apr. 2003).

J. Liang et al., *Nonlithographic Fabrication of Lateral Superlattices for Nanometric Electromagnetic-Optic...* IEEE J. Selected Topics in Quantum Electr., vol. 8, No. 5, pp. 998-1008 (Sep./Oct. 2002).

C. Y. Liu et al., *Ordered anodic alumina nanochannels on focused-ion-beam-prepatterned aluminum surfaces*, Appl. Phys. Lett., vol. 78, No. 1, pp. 120-122 (Jan. 2001).

E. Maire et al., *In Situ X-Ray Tomography Measurements of Deformation in Cellular Solids*, MRS Bulletin, pp. 284-289 (Apr. 2003).

H. Masuda et al., *Highly ordered nanochannel-array architecture in anodic alumina*, App. Phys. Lett, vol. 71, No. 19, pp. 2770-2772 (Nov. 1997).

A. Nadeem et al., *Fabrication of Microstructures Using Aluminum Anodization Techniques*, pp. 274-277 (pre-2004).

G. H. Oh et al., *Preparation and Pore-Characterizations Control of Nano-Porous Materials Using Organometallic Building Blocks*, Carbon Science, vol. 4, No. 1, pp. 1-9 (Mar. 2003).

P. R. Onck, *Scale Effects in Cellular Metals*, MRS Bulletin, pp. 279-283 (Apr. 2003).

J. P. O'Sullivan et al., *The morphology and mechanism of formation of porous anodic films on aluminium*, Proc. Roy. Soc. Lond. A, vol. 317, pp. 511-543 (1970).

J. M. Park et al., *Novel Robust Cell Capacitor(Leaning Exterminated Ring Type Insulator) and New Storage Node Contact*, IEEE, 2004 Symposium on VLSI Technology Diges6t of Technical Papers, pp. 34-35.

M. Park et al., *Block Copolymer Lithography: Periodic Arrays of ~10" Holes in 1 Square Centimeter*, Science, vol. 276, pp. 1401-1404 (May 1997).

S. Shingubara, *Fabrication of nanomaterials using porous alumina templates*, J. Nanoparticle Res., vol. 5, pp. 17-30 (2003).

S. Tan et al., *High Aspect Ratio Microstructures on Porous Anodic Aluminum Oxide*, IEEE, pp. 267-272 (1995).

M. Tsukada et al., *Preparation and Application of Porous Silk Fibroin Materials*, J. Appl. Polymer Sci., vol. 54, pp. 507-514 (1994).

U.S. Appl. No. 11/083,489, filed Mar. 2005, Sandhu et al.
U.S. Appl. No. 11/131,575, filed May 2005, Manning et al.
U.S. Appl. No. 11/196,593, filed Aug. 2005, Sandhu et al.
U.S. Appl. No. 11/360,540, filed Feb. 2006, Rana.
U.S. Appl. No. 11/580,418, filed Oct. 2006, Raghu et al.
Li, X. and Bohn, P.W., *"Metal-assisted chemical etching in $HF/H_2O_2$ produces porous silicon"*, Applied Physics Letters, vol. 77, No. 16, Oct. 16, 2000, pp. 2572-2574.
US04/0027898, Aug. 26, 2004, Written Opinion.
US06/06806, Mar. 30, 2007, IPER.
US06/06806, Jan. 12, 2004, Search Report.
US06/06806, Aug. 26, 2004, Written Opinion.
US06/06806, Aug. 26, 2004, Response to Written Opinion.
Yasaitis et al., *"A modular process for integrating thick polysilicon MEMS devices with sub-micron CMOS"*, Analog Devices, Pre-2004, pp. 1-10.

* cited by examiner

_FIG. II_II

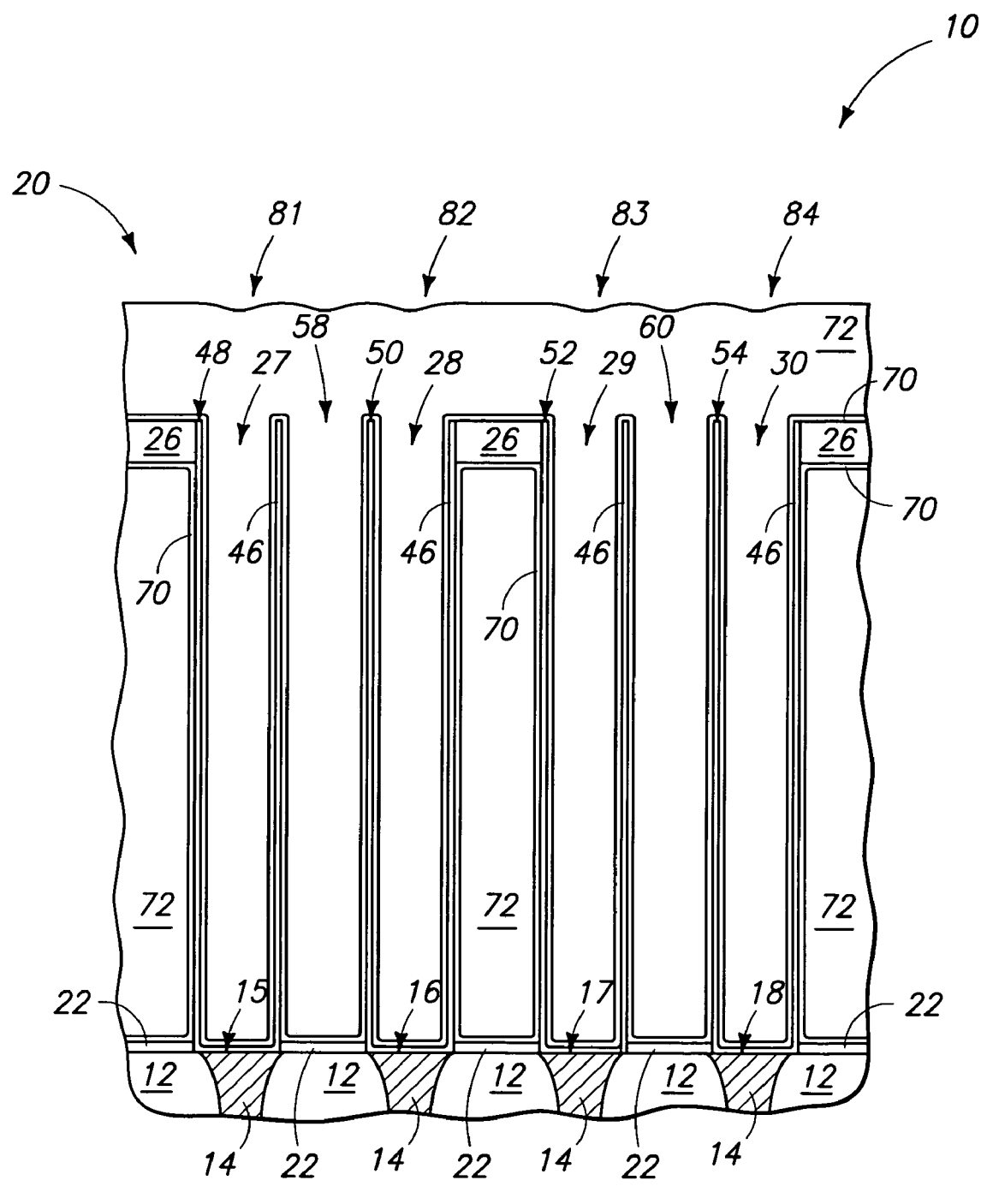
F I G 14

US 7,517,753 B2

METHODS OF FORMING PLURALITIES OF CAPACITORS

TECHNICAL FIELD

This invention relates to methods of forming pluralities of capacitors.

BACKGROUND OF THE INVENTION

Capacitors are one type of component which is commonly used in the fabrication of integrated circuits, for example in DRAM circuitry. A typical capacitor is comprised of two conductive electrodes separated by a non-conducting dielectric region. As integrated circuitry density has increased, there is a continuing challenge to maintain sufficiently high storage capacitance despite typical decreasing capacitor area. The increase in density of integrated circuitry has typically resulted in greater reduction in the horizontal dimension of capacitors as compared the vertical dimension. In many instances, the vertical dimension of capacitors has increased.

One manner of forming capacitors is to initially form an insulative material within which a capacitor storage node electrode is formed. For example, an array of capacitor electrode openings for individual capacitors is typically fabricated in such insulative capacitor electrode-forming material, with a typical insulative electrode-forming material being silicon dioxide doped with one or both of phosphorus and boron. The capacitor electrode openings are typically formed by etching. However, it can be difficult to etch the capacitor electrode openings within the insulative material, particularly where the openings are deep.

Further and regardless, it is often desirable to etch away most if not all of the capacitor electrode-forming material after individual capacitor electrodes have been formed within the openings. Such enables outer sidewall surfaces of the electrodes to provide increased area, and thereby increased capacitance for the capacitors being formed. However, the capacitor electrodes formed in deep openings are typically correspondingly much taller than they are wide. This can lead to toppling of the capacitor electrodes either during the etch to expose the outer sidewall surfaces, during transport of the substrate, and/or during deposition of the capacitor dielectric layer or outer capacitor electrode layer. Our U.S. Pat. No. 6,667,502 teaches provision of a brace or retaining structure intended to alleviate such toppling.

While the invention was motivated in addressing the above identified issues, it is in no way so limited. The invention is only limited by the accompanying claims as literally worded, without interpretative or other limiting reference to the specification, and in accordance with the doctrine of equivalents.

SUMMARY

The invention includes methods of forming pluralities of capacitors. In one implementation, a method of forming a plurality of capacitors includes anodically etching individual capacitor electrode channels within a material over individual capacitor storage node locations on a substrate. The channels are at least partially filled with electrically conductive capacitor electrode material in electrical connection with the individual capacitor storage node locations. The capacitor electrode material is incorporated into a plurality of capacitors.

In one implementation, a method of forming a plurality of capacitors includes forming metal over individual capacitor storage node locations on a substrate. A patterned masking layer is formed over the metal. The patterned masking layer comprises openings therethrough to the metal. Individual of the openings are received over individual of the capacitor storage node locations. The metal is anodically etched through the openings effective to form a single metal oxide-lined channel in individual of the openings over the individual capacitor storage nodes. Individual capacitor electrodes are formed within the channels in electrical connection with the individual capacitor storage node locations. At least some of the metal oxide is removed from the substrate and the individual capacitor electrodes are incorporated into a plurality of capacitors.

Other aspects and implementations are contemplated.

BRIEF DESCRIPTION OF THE DRAWINGS

Preferred embodiments of the invention are described below with reference to the following accompanying drawings.

FIG. 14 is a view of the FIG. 13 substrate at a processing step subsequent to that shown by FIG. 13.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
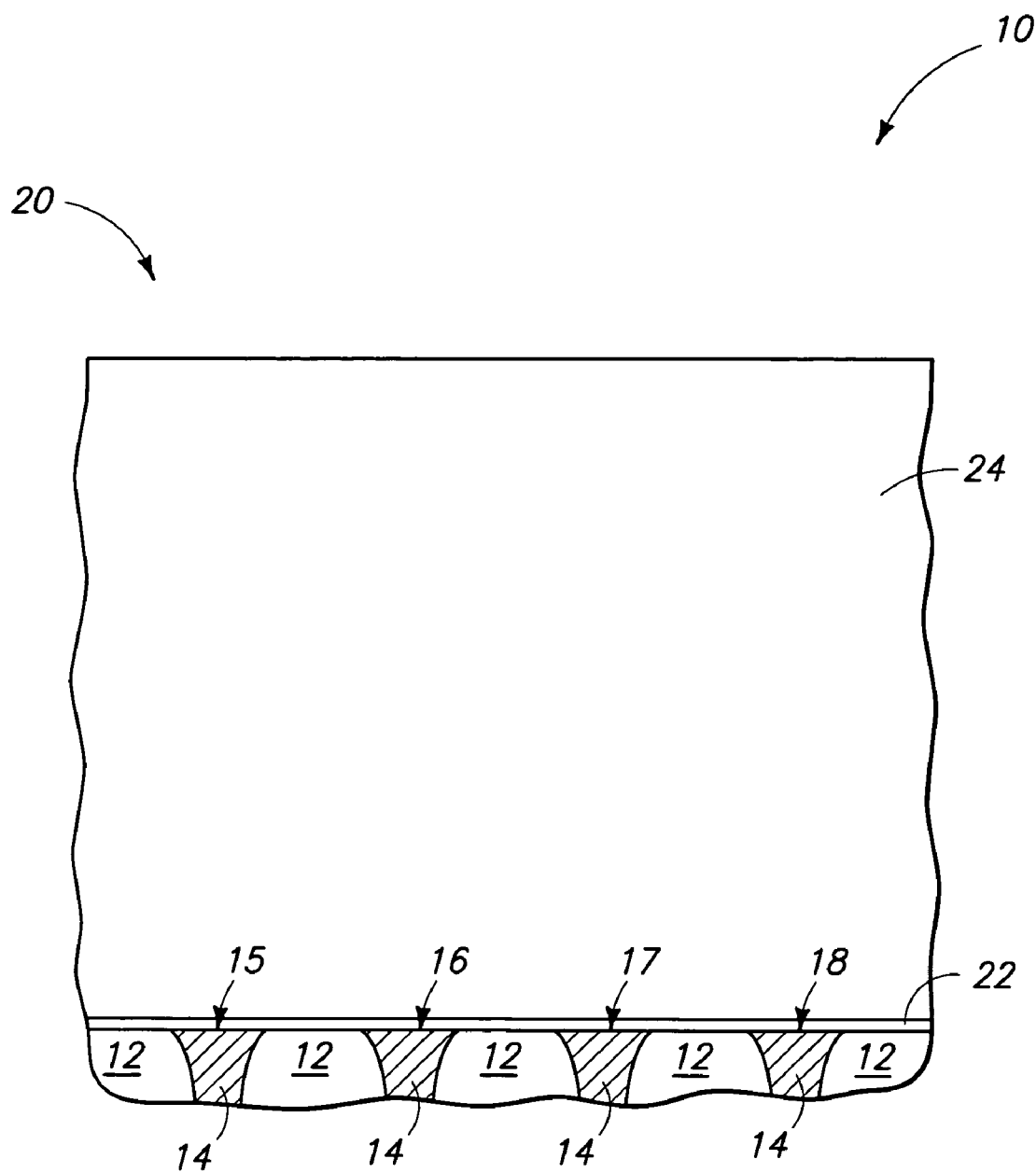
FIG. 1 is a diagrammatic cross section of a substrate fragment in process in accordance with an aspect of the invention.

Exemplary preferred methods of forming a plurality of capacitors are described with reference to FIGS. 1-16. FIG. 1 depicts a substrate 10 preferably comprising a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Accordingly and by way of example only, FIG. 1 might comprise a bulk semiconductor material (not shown), for example bulk monocrystalline silicon and/or alternately comprise semiconductor-on-insulator layers.

FIG. 1 depicts an insulative material 12 having electrically conductive storage node pillars 14 formed therethrough. Materials 12 and 14 would typically be fabricated over some suitable underlying material, for example bulk monocrystalline silicon and/or other underlying circuitry. An exemplary insulative material 12 includes doped and undoped silicon dioxides, for example silicon dioxide deposited by decomposition of tetraethyl orthosilicate (TEOS) and/or borophosphosilicate glass (BPSG) and/or silicon nitride. Alternately by way of example only, material 12 might comprise anisotropically etched insulative spacers, for example formed about transistor gate lines. An exemplary preferred conductive material 14 is conductively doped polysilicon. Conductive material 14 can be considered as comprising or defining a plurality of capacitor storage node locations 15, 16, 17 and 18 on substrate 10. FIG. 1 can also be considered as depicting a capacitor array area 20 over substrate 10 within which a plurality of capacitors will be formed, in accordance with one preferred embodiment. Storage node locations 15, 16, 17 and 18 are exemplary only, and regardless may be conductive at this point in the process or made conductive subsequently.

An optional layer 22 has been formed over material 12 and capacitor storage node locations 15, 16, 17 and 18. An exemplary preferred material for layer 22 comprises silicon nitride deposited to an exemplary thickness range of from 100 Angstroms to 2,000 Angstroms. Layer 22 might optionally be included to provide an etch stop, or other, function. A material 24 is formed over individual capacitor storage node locations 15, 16, 17 and 18, and in the depicted exemplary embodiment, over layer 22. Layer 24 will be anodically etched as described below, and preferably comprises metal. In the context of this document, "metal" refers to metal in elemental form, or an alloy of elemental metals. An exemplary preferred thickness range for preferred metal 24 is from 1 micron to 10 microns, with 2 microns being a specific preferred example. Thinner thicknesses are of course contemplated. One exemplary preferred metal comprises aluminum. Other exemplary preferred metals comprise at least one of Ti, Ta, Nb, Zr, W, V, Hf, S, B and Bi. Such metals might, of course, be alloyed with any one or combination of the others, including any one or combination being alloyed with elemental aluminum. Preferably, metal 24 is very pure (in excess of 99.99 percent metal), and can be polished to provide a smooth outer surface.

Figure 2:
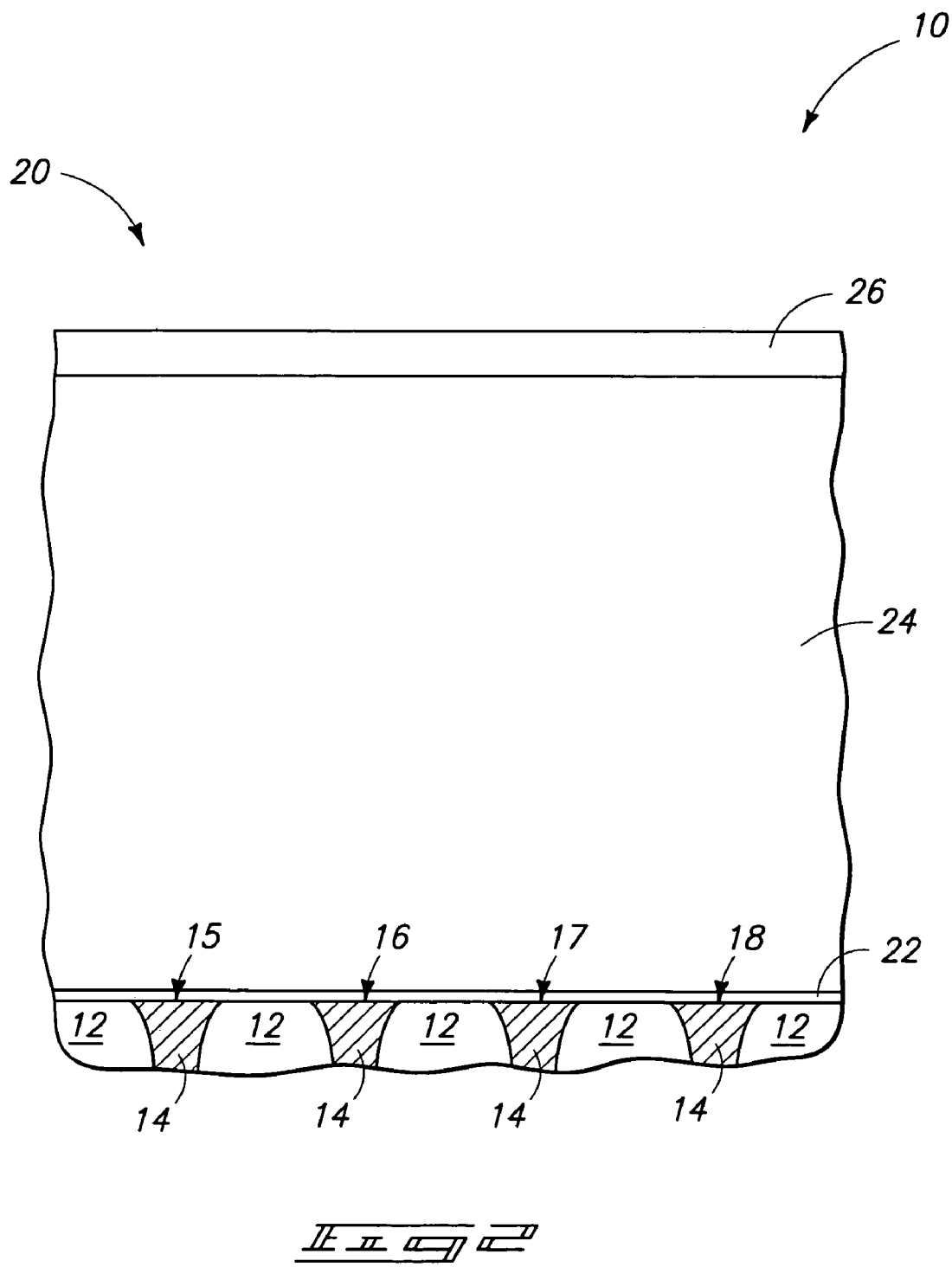
FIG. 2 is a view of the FIG. 1 substrate at a processing step subsequent to that shown by FIG. 1.

Referring to FIG. 2, a masking layer 26 has been deposited over preferred metal 24. Masking layer 26 might be any of electrically conductive, semiconductive or electrically insulative material, or combinations thereof. By way of example only, an exemplary preferred material 26 includes silicon nitride. Some or all of layer 26 might be removed, or some or all of layer 26 might remain over the substrate as part of finished circuitry construction incorporating the plurality of capacitors being fabricated. An exemplary preferred thickness for masking layer 26 is from 100 Angstroms to 5,000 Angstroms.

Figure 3:
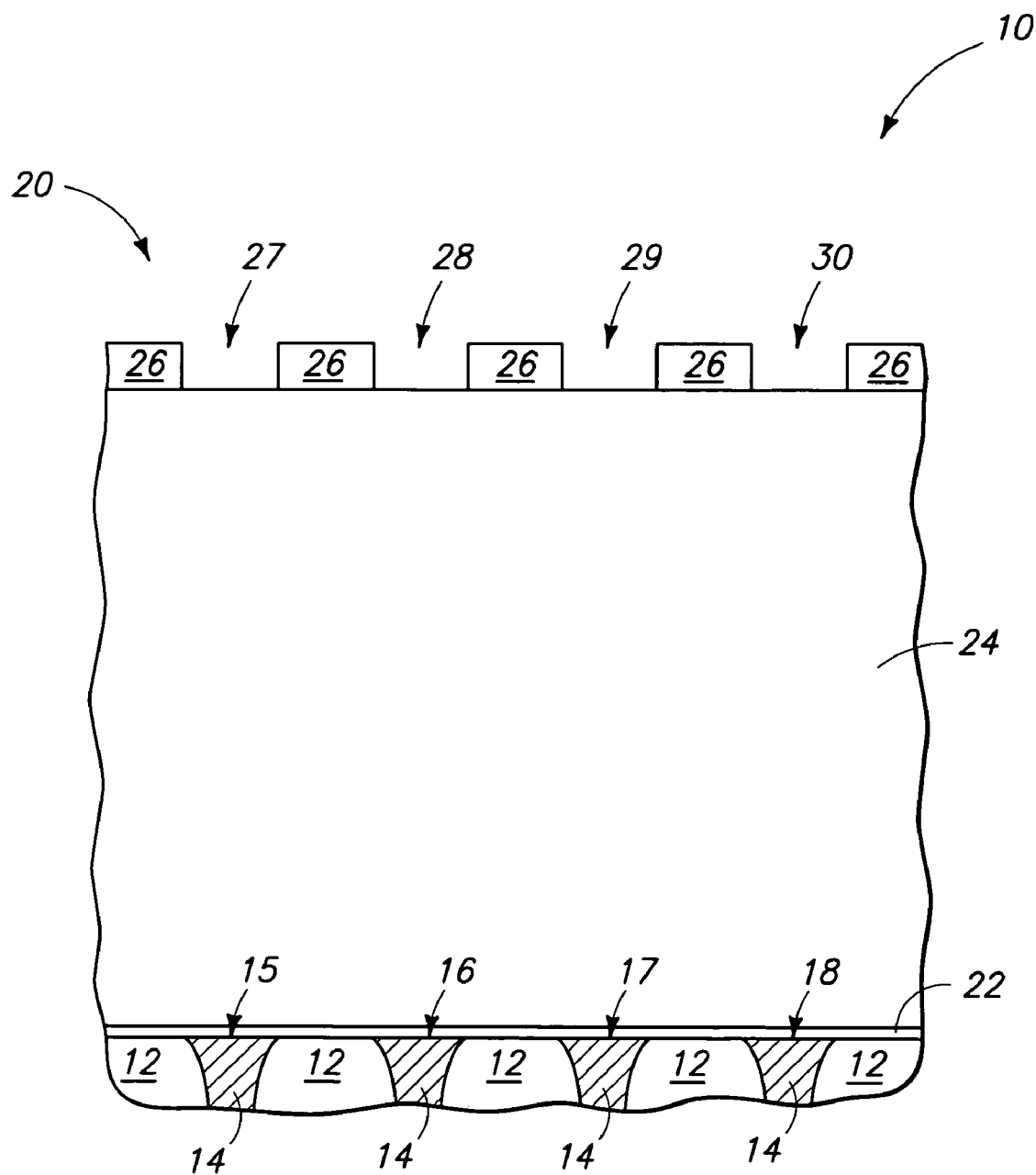
FIG. 3 is a view of the FIG. 2 substrate at a processing step subsequent to that shown by FIG. 2.
Figure 4:
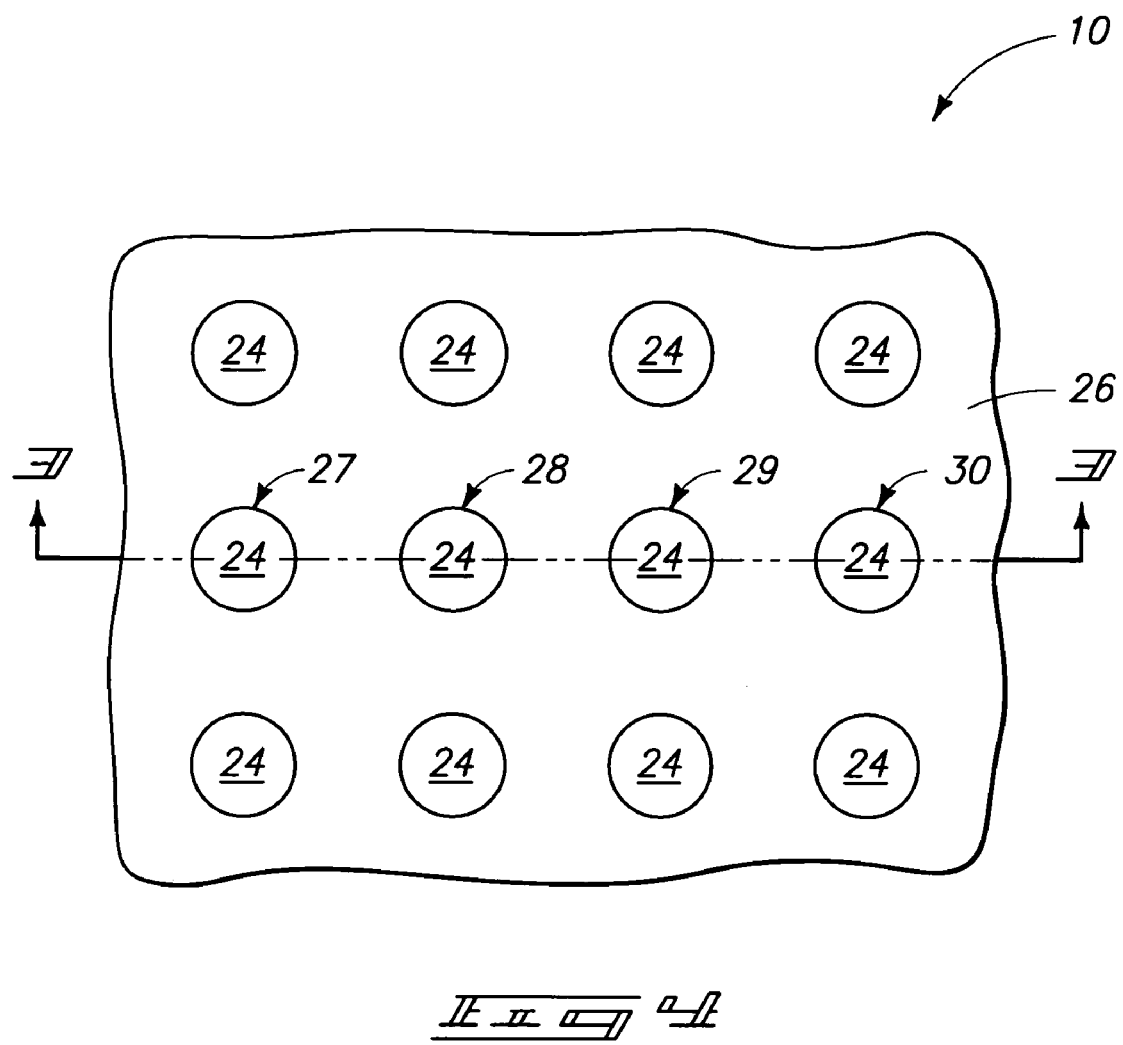
FIG. 4 is a diagrammatic top plan view of the FIG. 3 substrate.

Referring to FIGS. 3 and 4, masking layer 26 has been patterned over metal 24 effective to form openings 27, 28, 29 and 30 to metal 24. Additional corresponding openings are shown in FIG. 4. Individual of such openings 27, 28, 29 and 30 are received over individual of capacitor storage node locations 15, 16, 17 and 18, respectively. A preferred manner of forming openings 27, 28, 29 and 30 is by lithography and etch, for example and by way of example only, utilizing photolithography with an overlying masking layer such as photoresist (not shown). Such openings can be of any desired shape or shapes, for example any of circular, oval, elliptical, square, rectangular, etc.

The above-described processing is but only one example of forming a patterned masking layer over a material to be anodically etched, such as metal, wherein the patterned masking layer comprises openings therethrough, and whereby individual of such openings are received over individual of the capacitor storage node locations. Of course, any other manner of forming such an exemplary patterned masking layer is also contemplated, and whether existing or yet-to-be developed.

Figure 5:
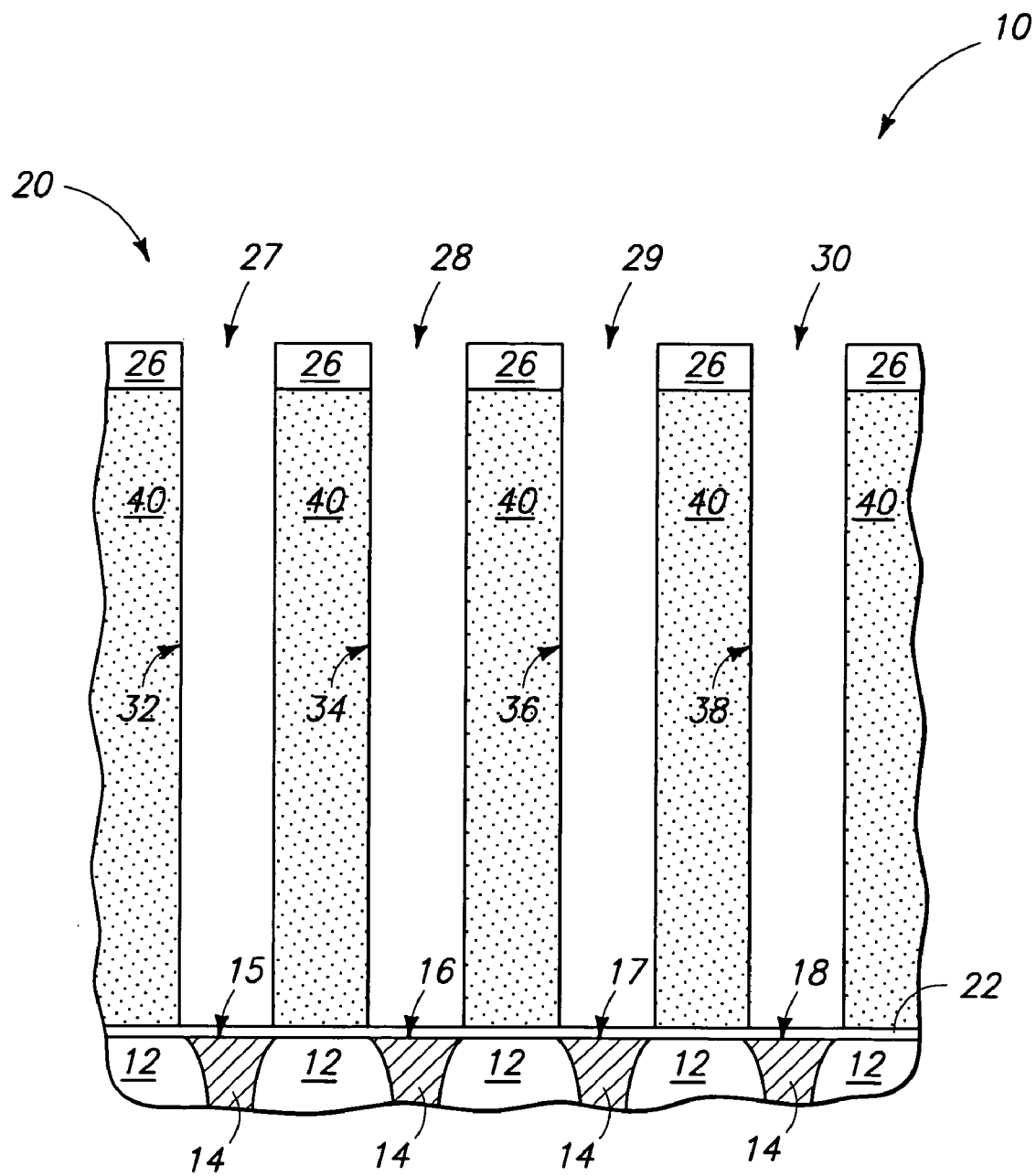
FIG. 5 is a view of the FIG. 3 substrate at a processing step subsequent to that shown by FIG. 3.
Figure 6:
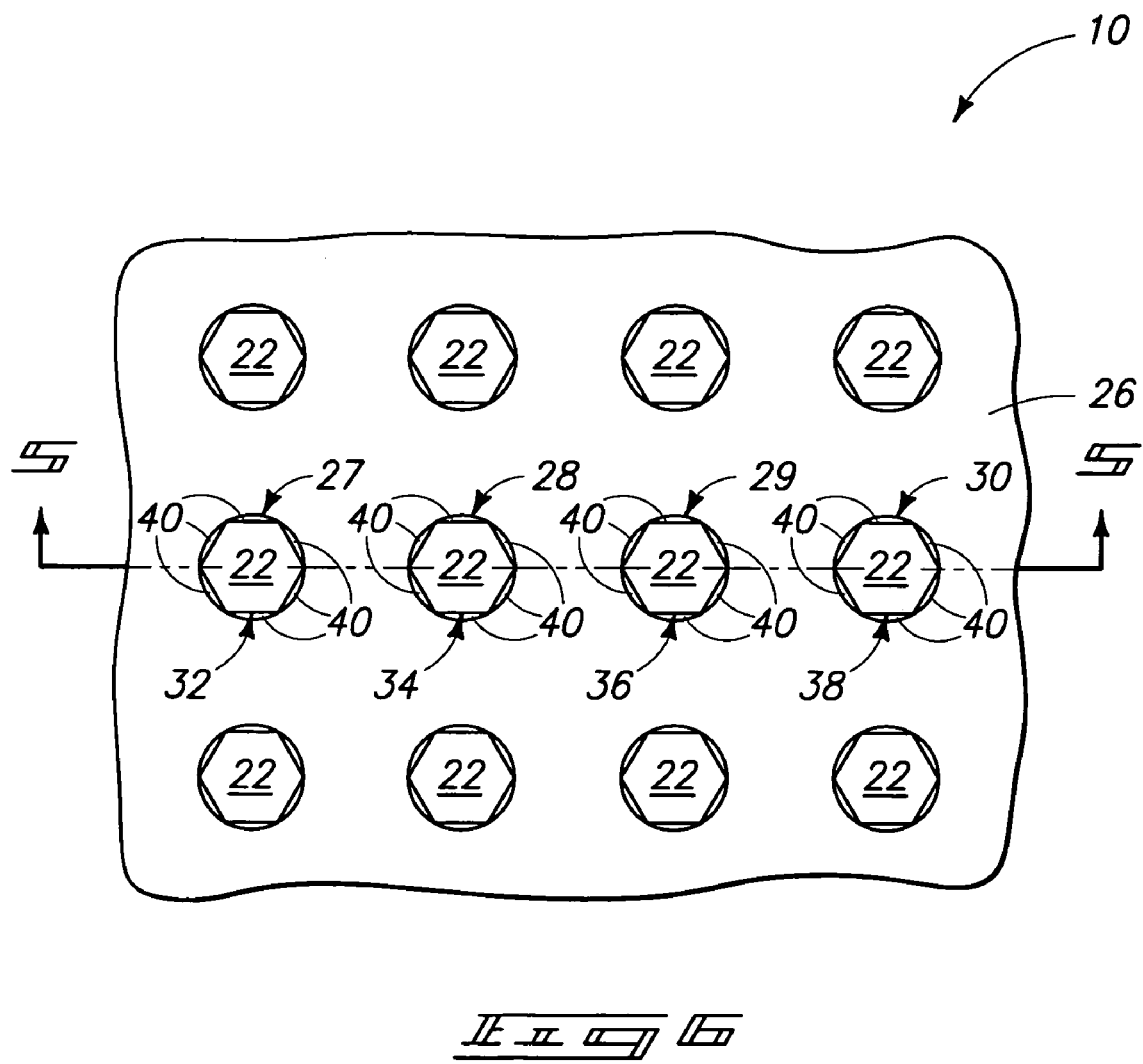
FIG. 6 is a diagrammatic top plan view of the FIG. 5 substrate.

Referring to FIGS. 5 and 6, material 24 (not shown) has been anodically etched through openings 27, 28, 29 and 30 effective to form a single metal oxide-lined channel 32, 34, 36 and 38 in individual of openings 27, 28, 29 and 30, respectively, over individual capacitor storage nodes 15, 16, 17 and 18, respectively. Where material 24 comprises metal, the anodic etching might oxidize all of such metal into metal oxide material 40 (as shown). Alternately by way of example only, such anodic etching might not oxidize all of the metal to metal oxide. For example and by way of example only, the anodic etching might only oxidize an elevationally upper or outermost portion of material 24 of FIG. 3, or not all of material 24 received laterally between openings 32, 34, 36 and 38 independent of elevation. FIGS. 5 and 6 depict an exemplary preferred embodiment wherein the anodic etching forms the channels to extend completely to optional layer 22, and also wherein such etching does not form channels 32, 34, 36 and 38 to extend to or expose individual capacitor storage node locations 15, 16, 17 and 18 at this point in the process. Alternately, for example if layer 22 were not present, exemplary preferred anodic etching might form the channels to extend to and expose the individual capacitor storage locations. Further alternately, and by way of example only were a layer 22 not utilized, the invention also contemplates anodic etching wherein channels 32, 34, 36 and 38 do not necessarily extend completely to the individual capacitor storage node locations at this point in the process. A subsequent etch could be conducted to expose such locations prior to forming individual capacitor electrodes, for example as is described subsequently. Where, for example, a preferred metal 24 comprises aluminum, the metal oxide will comprise aluminum oxide.

Anodic etching of aluminum and other metals disclosed herein can be conducted with various chemistries and in various manners. An exemplary typical technique comprises positioning the substrate in an acid bath. Metal 24 is tied/connected with some suitable potential and comprises one electrode of a circuit. The bath comprises the other electrode of the circuit. For example and by way of example only, typical acids include oxalic acid, chromic acid, sulfuric acid, phosphorus acid and boric acid, and including combinations of these. Acid concentration is generally at 1% to 20% by weight, and more preferably from 2% to 10% by weight, but as well, can be conducted outside of these ranges. Exemplary preferred voltages are from 10 volts to 120 volts. Preferred anodic etching is preferably carried out at a constant voltage, with a current draw on the substrate being on the order of about 1 to 30 mA/cm$^2$.

The exemplary depicted channels 32, 34, 36 and 38 are depicted as corresponding to the minimum lateral width dimensions of openings 27, 28, 29 and 30 in masking layer 26, although such may not exactly so coincide at this point or subsequently in the process. For example, the size of the depicted channels 32, 34, 36 and 38 might be narrower than openings 27, 28, 29 and 30 at least as initially formed. Further if so, such might be widened after the anodic etching using a suitable etch chemistry, for example 5% by weight phosphoric acid for isotropically etching and widening the channels when such are formed in aluminum oxide formed by the anodic etching of aluminum. Accordingly under such circumstances and regardless, channels 32, 34, 36 and 38 might be narrower than, wider than, or equal to the depicted cross section of openings 27, 28, 29 and 30 in masking layer 26. Anodic etching may form channels 32, 34, 36, and 38 in material 40 as propagated by etching through the configuration of openings 27, 28, 29 and 30 into hexagonal cross sections as shown, although any other cross section is contemplated.

The size of channels 32, 34, 36 and 38 can be controlled as determined by the artisan by selection of the anodizing acid, as well as the applied voltage. For a given acid, higher voltages, and thereby greater current densities, tend to produce wider channels, with an exemplary preferred range being from 0.9 to 1.2 nanometers/Volt. An exemplary preferred current density range is from 10 to 80 milliamps/$cm^2$. With respect to the type of acid used, larger to smaller cell sizes tend in an apparent ordering of sulfuric acid, oxalic acid, chromic acid and phosphoric acid. Preferred and other exemplary aspects of anodic etching, for example using aluminum, are disclosed in the following articles, which are provided as exemplary processing techniques for anodic etching, for example which might be utilized in accordance with the invention: Songsheng Tan et al., *High Aspect Ratio Microstructures on Porous Anodic Aluminum Oxide*, IEEE, pp. 267-272 (1995); Ahmed Nadeem et al., *Fabrication of Microstructures Using Aluminum Anodization Techniques*, pp. 274-277; C. Y. Liu et al., *Ordered anodic alumina nanochannels on focused-ion-beam-prepatterned aluminum surfaces*, APPL. PHYS. LETT., Vol. 78, No. 1, pp. 120-122 (Jan. 1, 2001); Shoso Shingubara, *Fabrication of nanomaterials using porous alumina templates*, JOURNAL OF NANOPARTICLE RESEARCH, Vol. 5, pp. 17-30 (2003); and Hideki Masuda et al., *Highly ordered nanochannel-arrayarchitecture in anodic alumina*, Appl. Phys. Lett., Vol. 71, No. 19, pp. 2770-2772 (Nov. 10, 1997).

Figure 7:
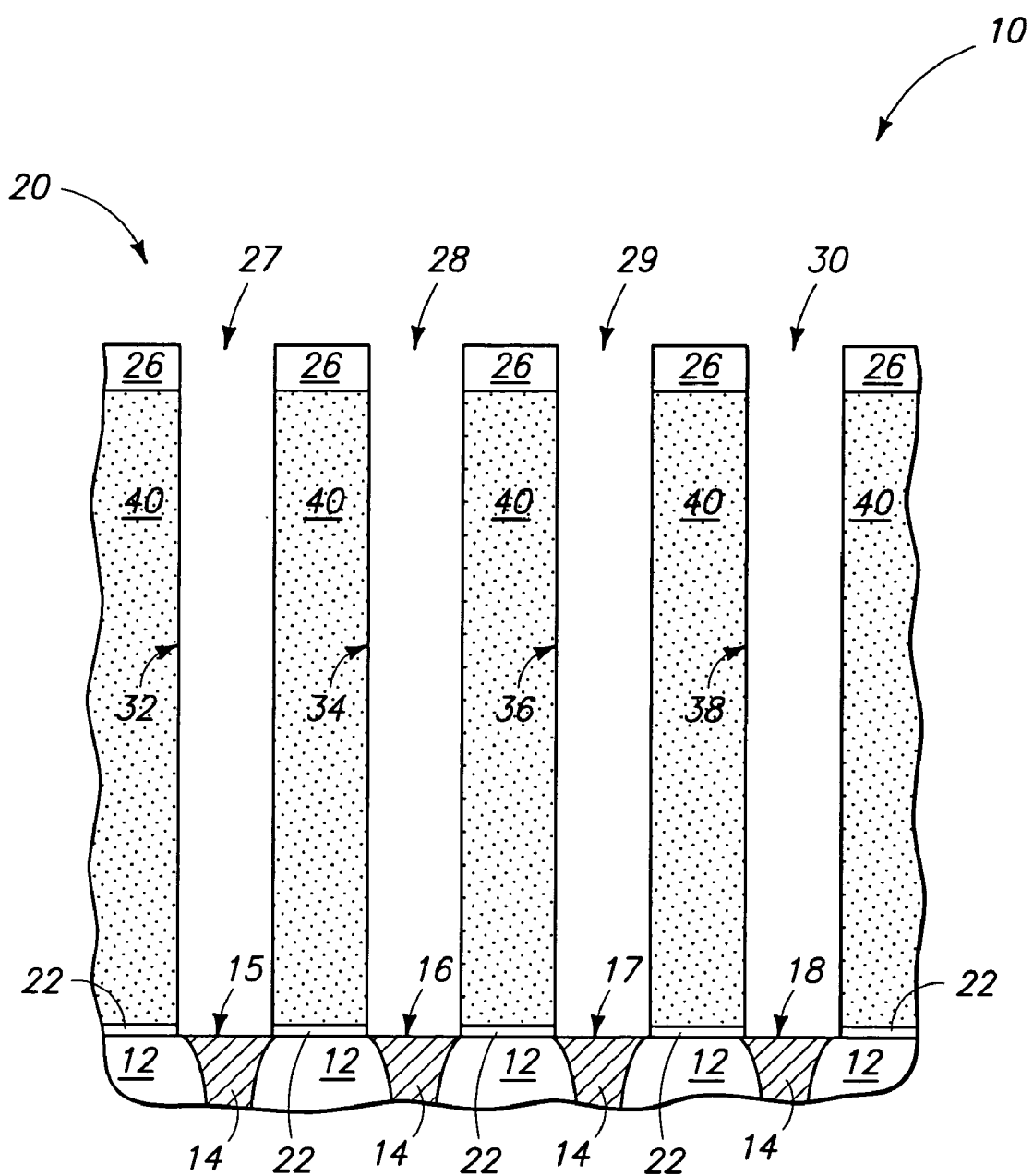
FIG. 7 is a view of the FIG. 5 substrate at a processing step subsequent to that shown by FIG. 5.

Referring to FIG. 7, and where for example the anodic etching did not form the channels to extend to and expose the individual capacitor storage node locations, material 22 has been etched from over individual capacitor storage node locations 15, 16, 17 and 18.

Figure 8:
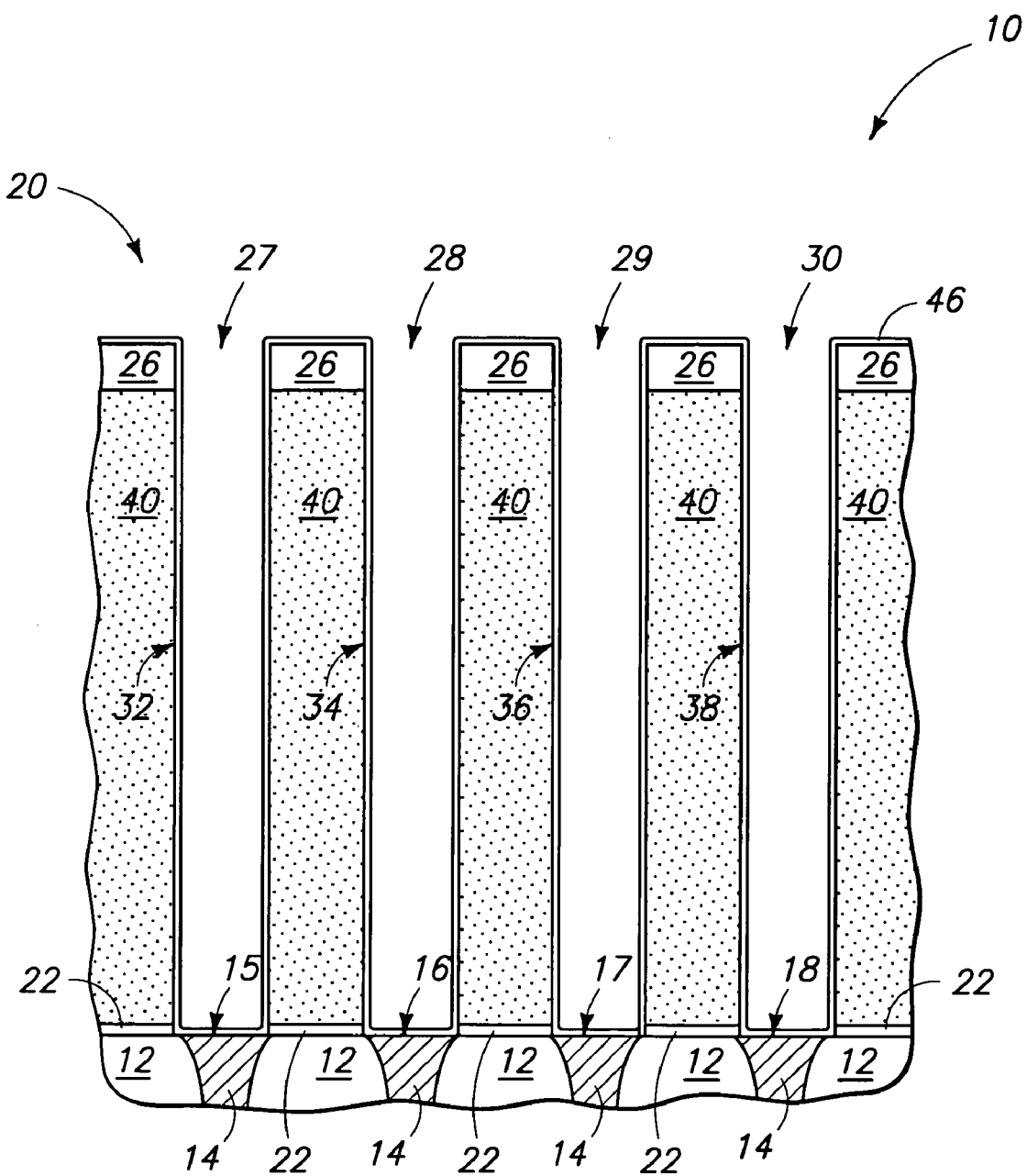
FIG. 8 is a view of the FIG. 7 substrate at a processing step subsequent to that shown by FIG. 7.

Referring to FIG. 8, an electrically conductive layer 46 has been deposited over patterned masking layer 26 and to within channels 32, 34, 36 and 38 effective to line such channels with such layer. Such might be deposited by any of physical vapor deposition, chemical vapor deposition, atomic layer deposition, and/or any other method, and whether existing or yet-to-be developed. An exemplary material comprises titanium nitride.

Figure 9:
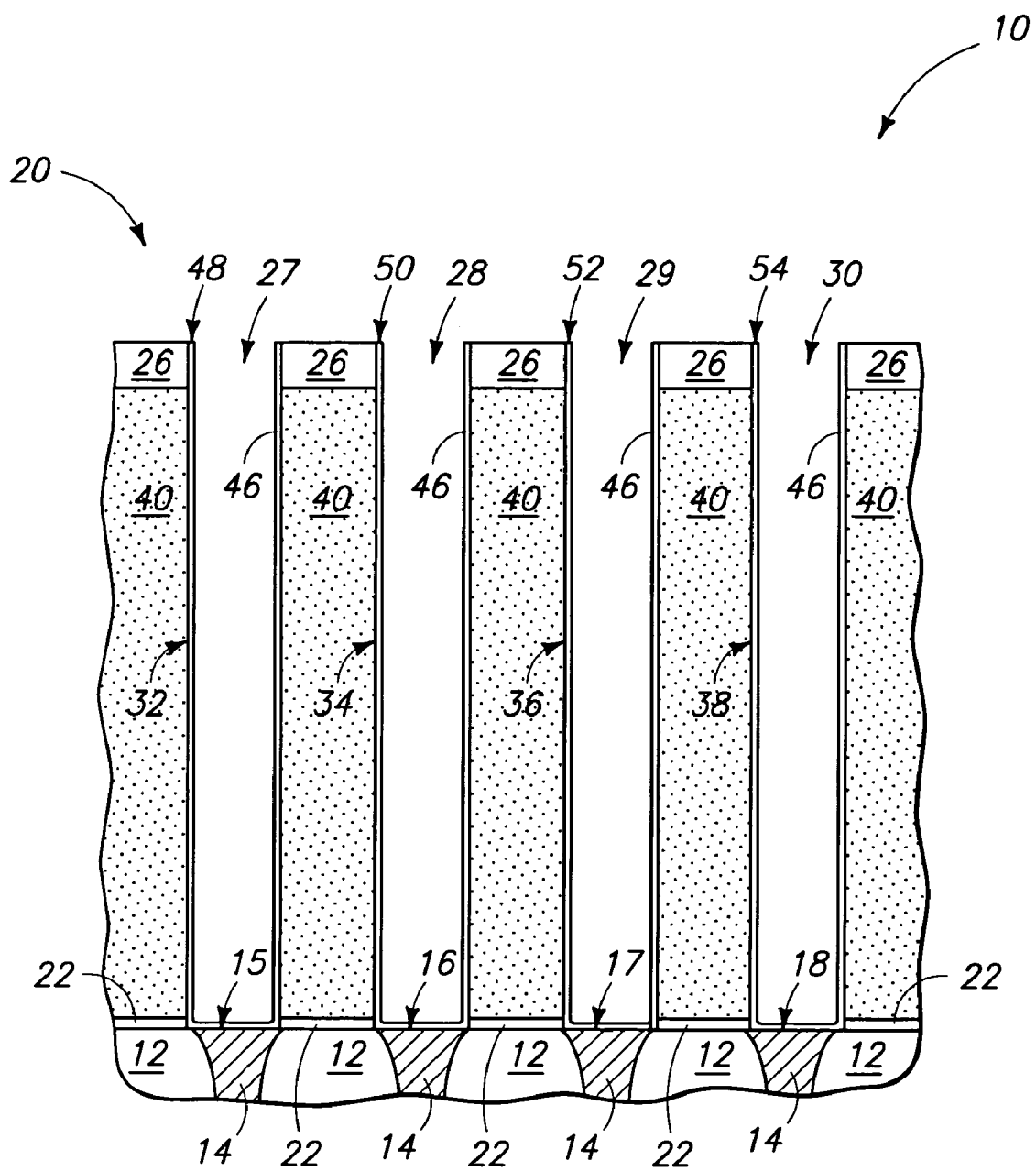
FIG. 9 is a view of the FIG. 8 substrate at a processing step subsequent to that shown by FIG. 8.

Referring to FIG. 9, electrically conductive layer 46 has been removed back at least to patterned masking layer 26, preferably and for example by polishing (such as chemical mechanical polishing) effective to form individual container-shaped capacitor electrodes 48, 50, 52 and 54 within channels 32, 34, 36 and 38, respectively, in electrical connection with individual capacitor storage node locations 15, 16, 17 and 18, respectively. Such provides but one exemplary method of at least partially filling the channels with electrically conductive capacitor electrode material which is provided in electrical connection with the individual capacitor storage node locations. The preferred and depicted individual capacitor electrodes have one or more individual container shapes, although any other shape is contemplated. For example and by way of example only, channels 32, 34, 36 and 38 might be completely filled with electrically conductive capacitor electrode material, thereby forming solid pillars or other shapes.

In the depicted FIGS. 1-9 embodiment, patterned masking layer 26 might still, subsequent to the FIG. 6 processing, mask an entirety of underlying material 24/40 but for openings formed through masking layer 26 within which the individual capacitor electrodes are formed. Further and regardless, certain aspects of the invention contemplate removal of at least some of the metal oxide from the substrate prior to the formation of capacitor dielectric and outer capacitor electrode materials, for example in maximizing capacitor area.

Figure 10:
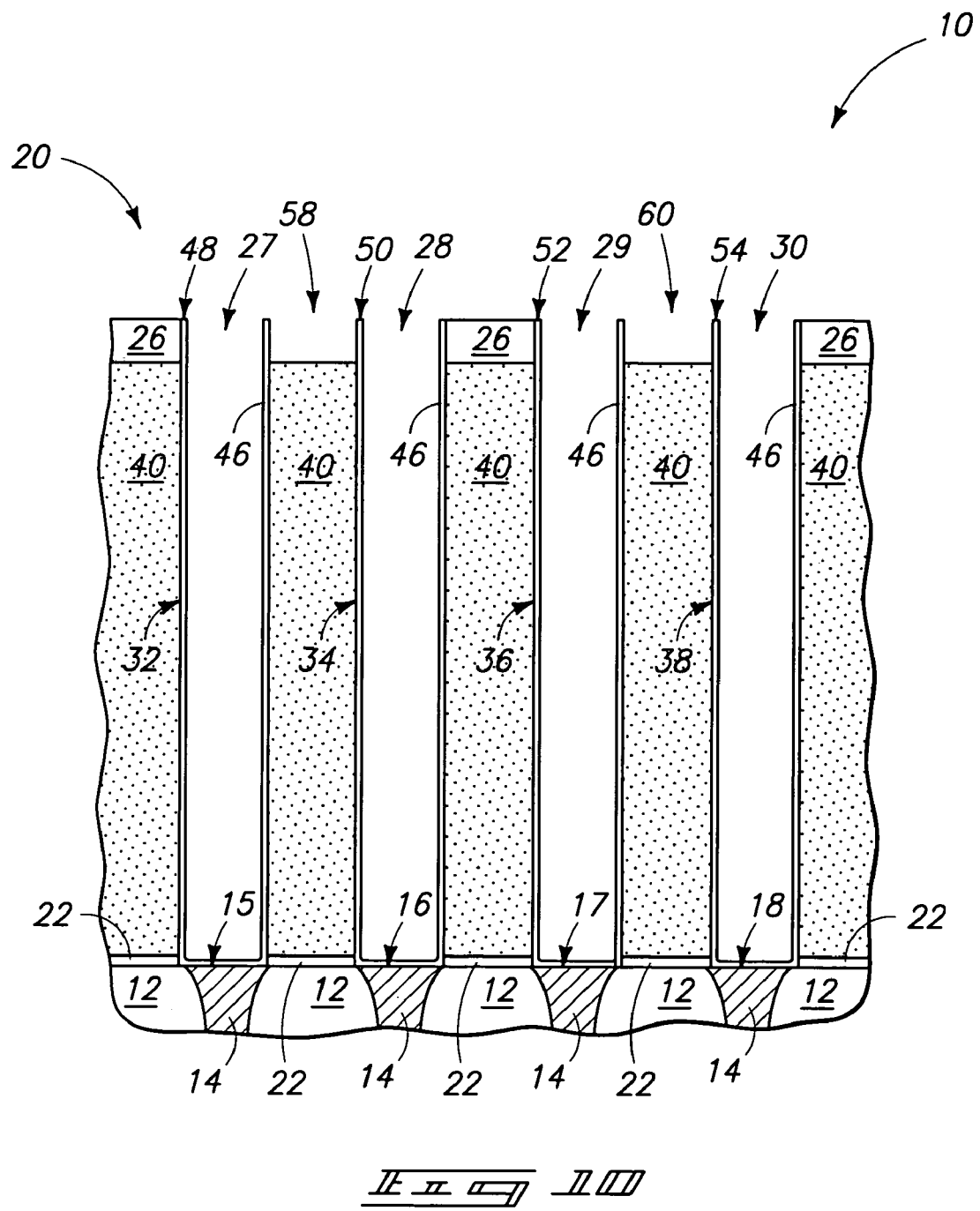
FIG. 10 is a view of the FIG. 9 substrate at a processing step subsequent to that shown by FIG. 9.
Figure 11:
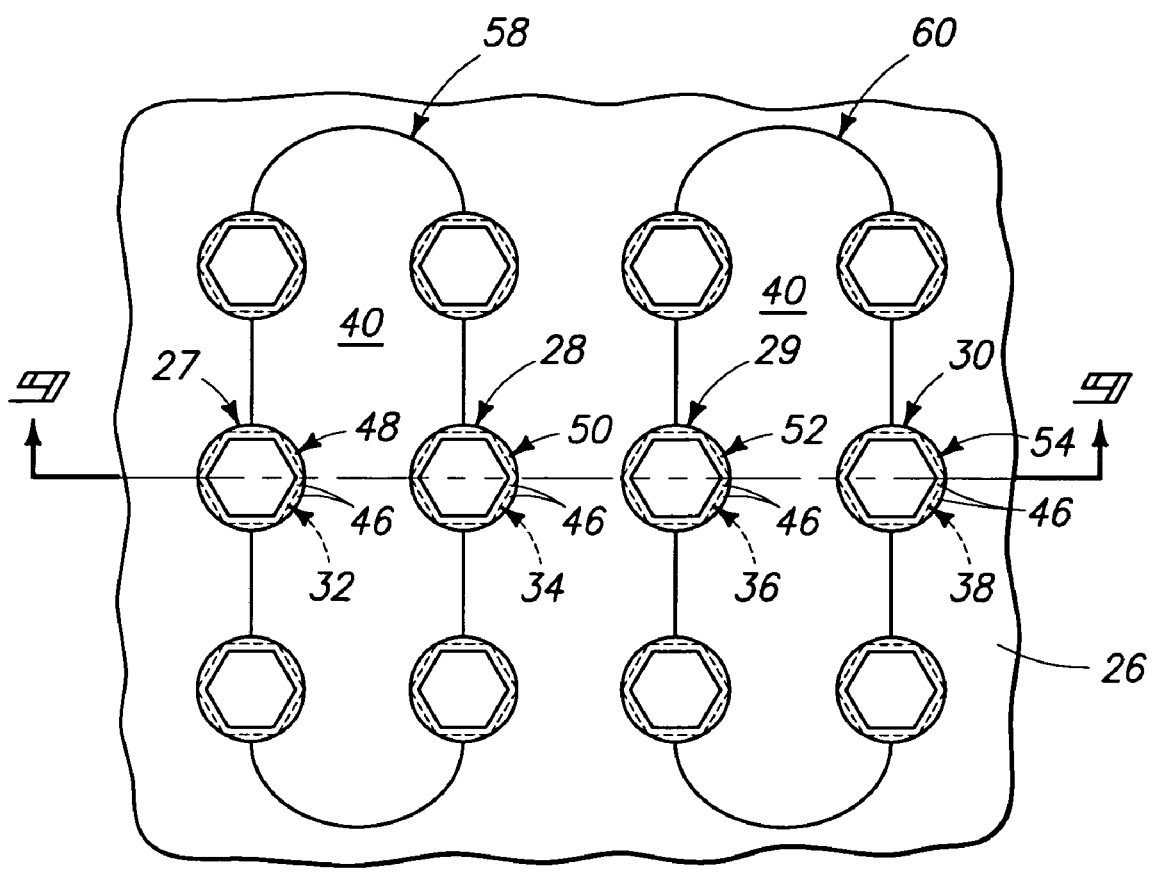
FIG. 11 is a diagrammatic top plan view of the FIG. 10 substrate.

For example and by way of example only, FIGS. 10 and 11 depict the formation of access openings 58 and 60 within masking layer 26 to metal oxide 40. A preferred manner of forming the same, where such are formed, is by lithographic patterning and etch. Such also provides an example of removing at least some of masking layer 26 from substrate 10 after forming individual capacitor electrodes 48, 50, 52 and 54. In some implementations, at least some of the material of patterned masking layer 26 remains as part of finished circuitry construction incorporating the plurality of capacitors being fabricated. In other exemplary embodiments, patterned masking layer 26 might not constitute any part of the finished circuitry construction, and thereby, might be entirely sacrificial such that all of it is removed at the substrate at some point, for example and by way of example only, after the fabrication of individual capacitor electrodes 48, 50, 52 and 54. Again, alternately where such masking layer remains as part of the finished circuitry construction, which is preferred and as described, removal might be of only some of masking layer 26, for example as is depicted in the exemplary embodiment of FIGS. 10 and 11.

Figure 12:
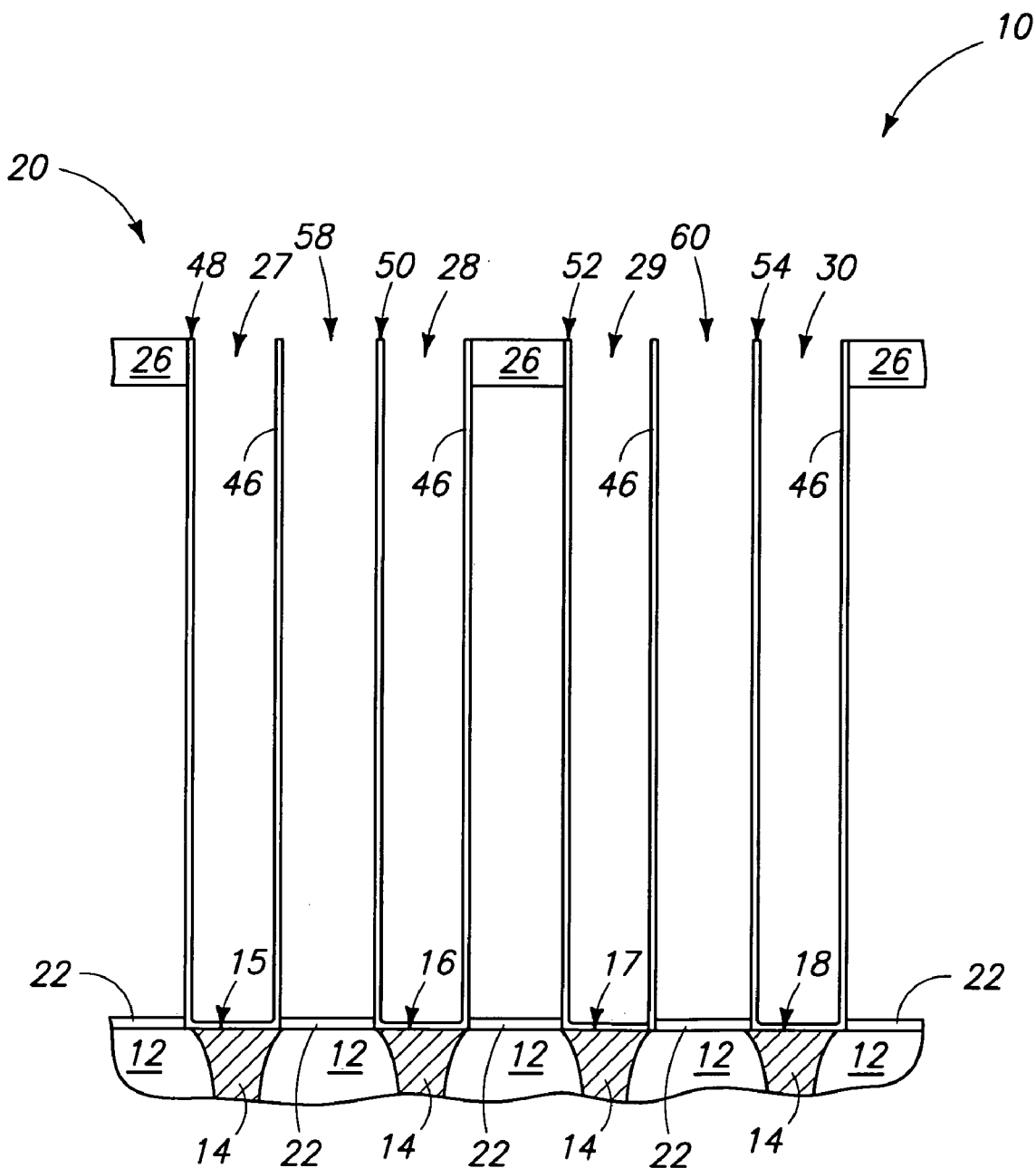
FIG. 12 is a view of the FIG. 10 substrate at a processing step subsequent to that shown by FIG. 10.

Referring to FIG. 12, at least some of metal oxide 40 has been removed from substrate 10. Preferably, such metal oxide is removed by etching through access openings 58 and 60. Only some, or all, of metal oxide material 40 might be removed, with all of such metal oxide depicted as having been etched away in FIG. 12, thereby preferably maximizing the exposure of outer sidewalls of individual capacitor electrodes 48, 50, 52 and 54. An exemplary etching technique, for example where material 46 is titanium nitride and material 40 is aluminum oxide, is a dilute HF wet chemistry, for example 200:1 by weight of a 49% by weight HF solution in water to water, at 70° C., and preferably in a low or no-oxygen ambient. Additional and/or alternate exemplary chemistries include $H_2O_2$, phosphoric acid, and/or mercury chloride.

Figure 13:
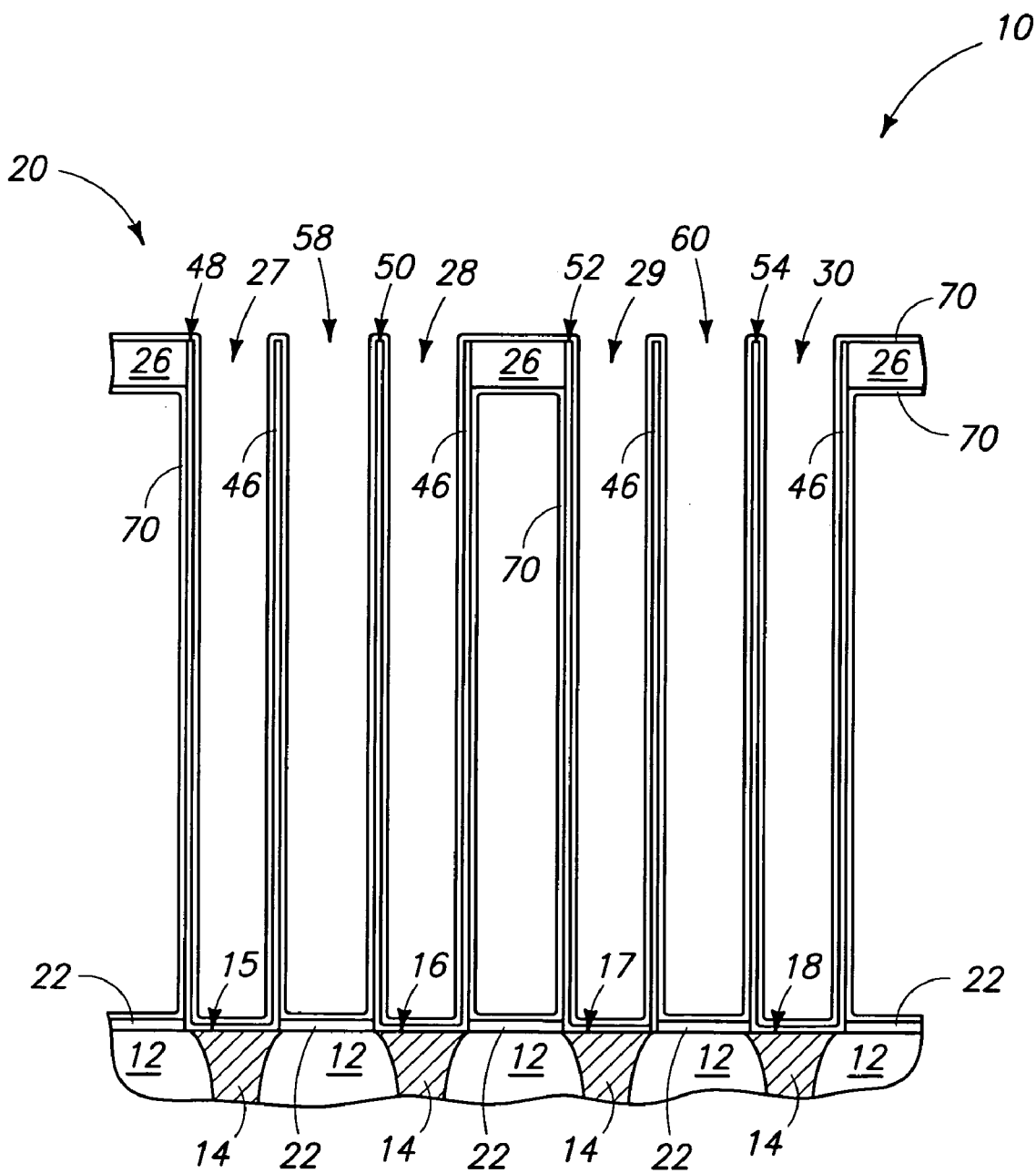
FIG. 13 is a view of the FIG. 12 substrate at a processing step subsequent to that shown by FIG. 12.

Regardless, capacitor electrode material 46 is ultimately incorporated into a plurality of capacitors. For example, FIG. 13 depicts the deposition of a capacitor dielectric layer 70 over patterned masking layer 26 and over the preferred embodiment container-shaped electrodes 48, 50, 52 and 54. By way of example only, an exemplary preferred material is a silicon dioxide, silicon nitride, silicon dioxide composite, or any suitable high k dielectric, whether existing or yet-to-be developed. By way of example only, exemplary high k dielectrics include $Ta_2O_5$ and barium strontium titanate. Capacitor dielectric layer 70 might be commonly deposited as a single layer over each of the inner capacitor electrodes (shown and preferred) or might be separately provided with respect to individual capacitor electrodes.

Figure 17:
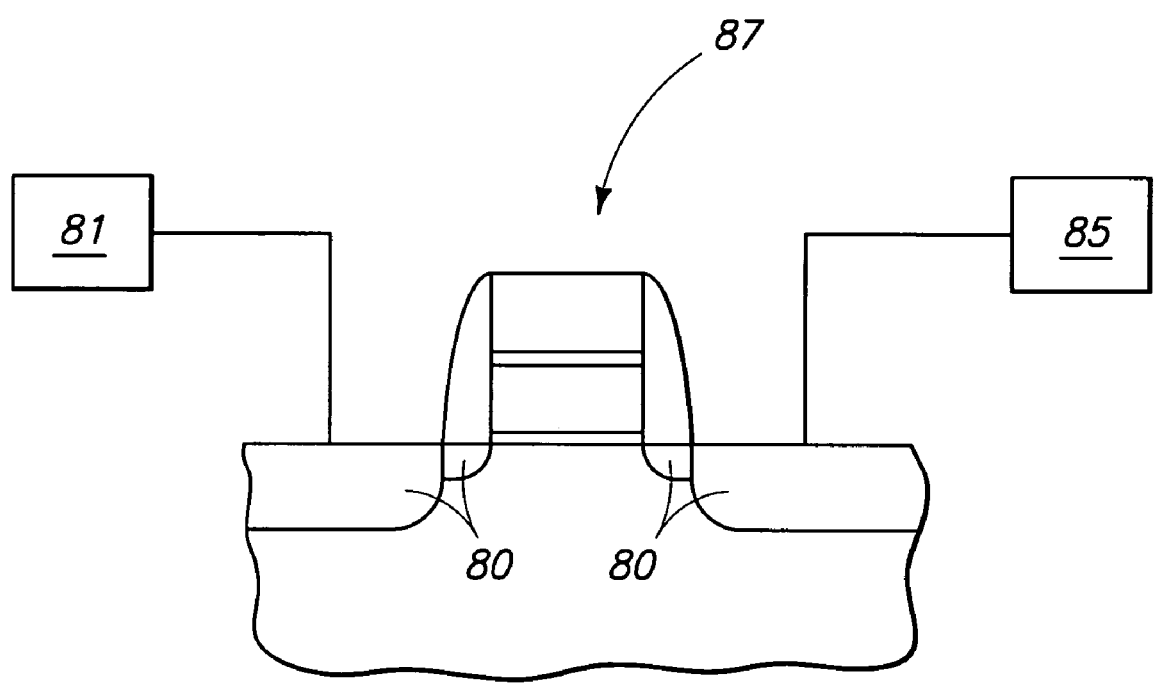
FIG. 17 is a diagrammatic representation of DRAM circuitry.

Referring to FIG. 14, an outer capacitor electrode layer 72 has been deposited over capacitor dielectric layer 70, thereby defining capacitors 81, 82, 83 and 84. Such are depicted as comprising a common cell capacitor plate to all of the depicted capacitors, for example as might be utilized in DRAM or other circuitry. For example and by way of example only, FIG. 17 depicts an exemplary DRAM cell incorporating capacitor 81. Such comprises an exemplary transistor gate word line 87 having insulative sidewall spacers, an insulative cap, a conductive region under the cap such as a silicide, a conductive polysilicon region under the silicide and a gate dielectric region under the polysilicon. Source/drain diffusion regions 80 are shown formed within semiconductive material operatively proximate word line 87. One of such electrically connects with capacitor 81, and another such electrically connects with a bit line 85. Of course alternately with respect to FIG. 14, separate outer capacitor electrodes might be configured with respect to each individual inner capacitor electrode or groups of individual capacitor electrodes.

Figure 15:
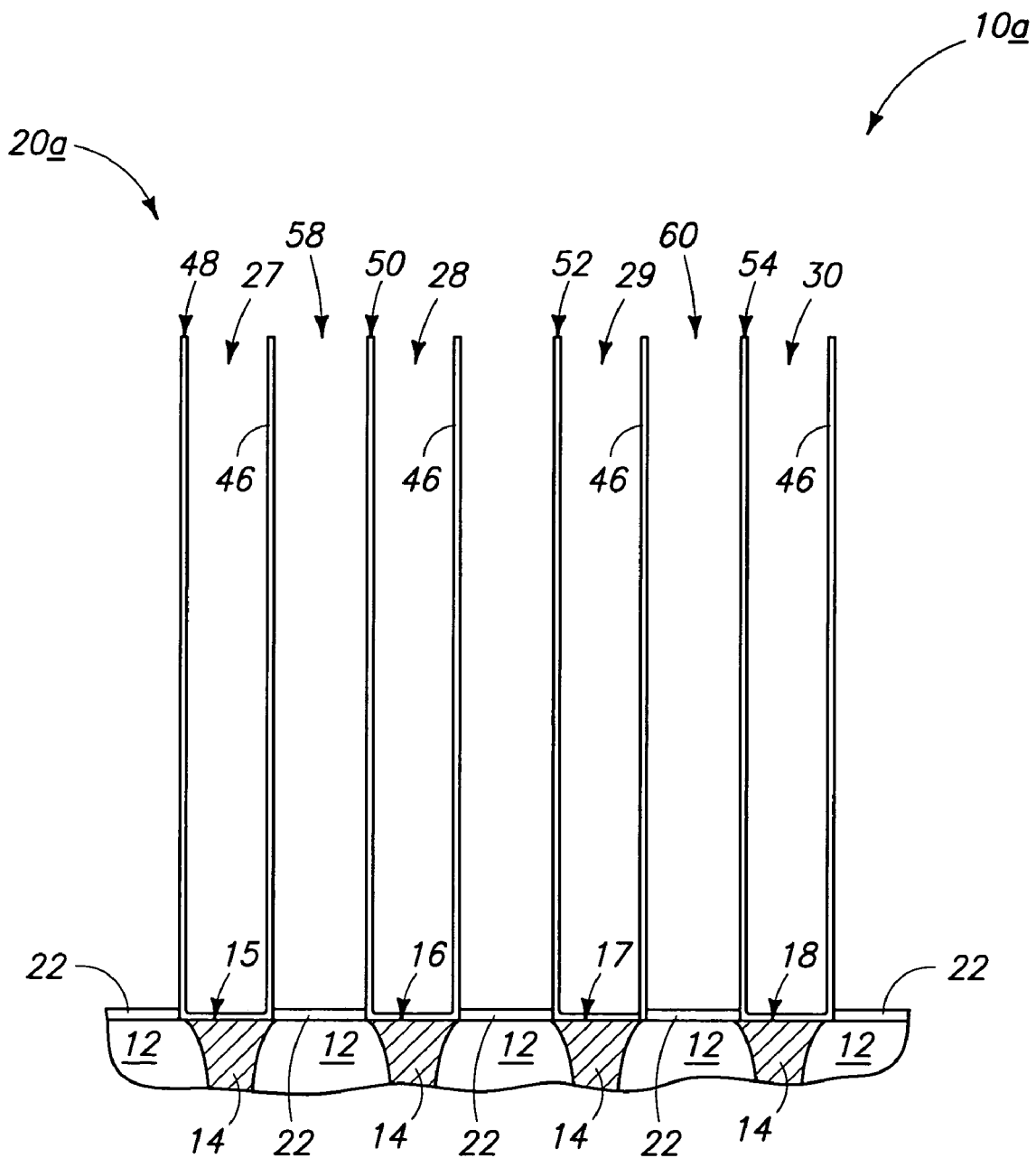
FIG. 15 is a diagrammatic cross section of an alternate substrate fragment in process in accordance with an aspect of the invention.
Figure 16:
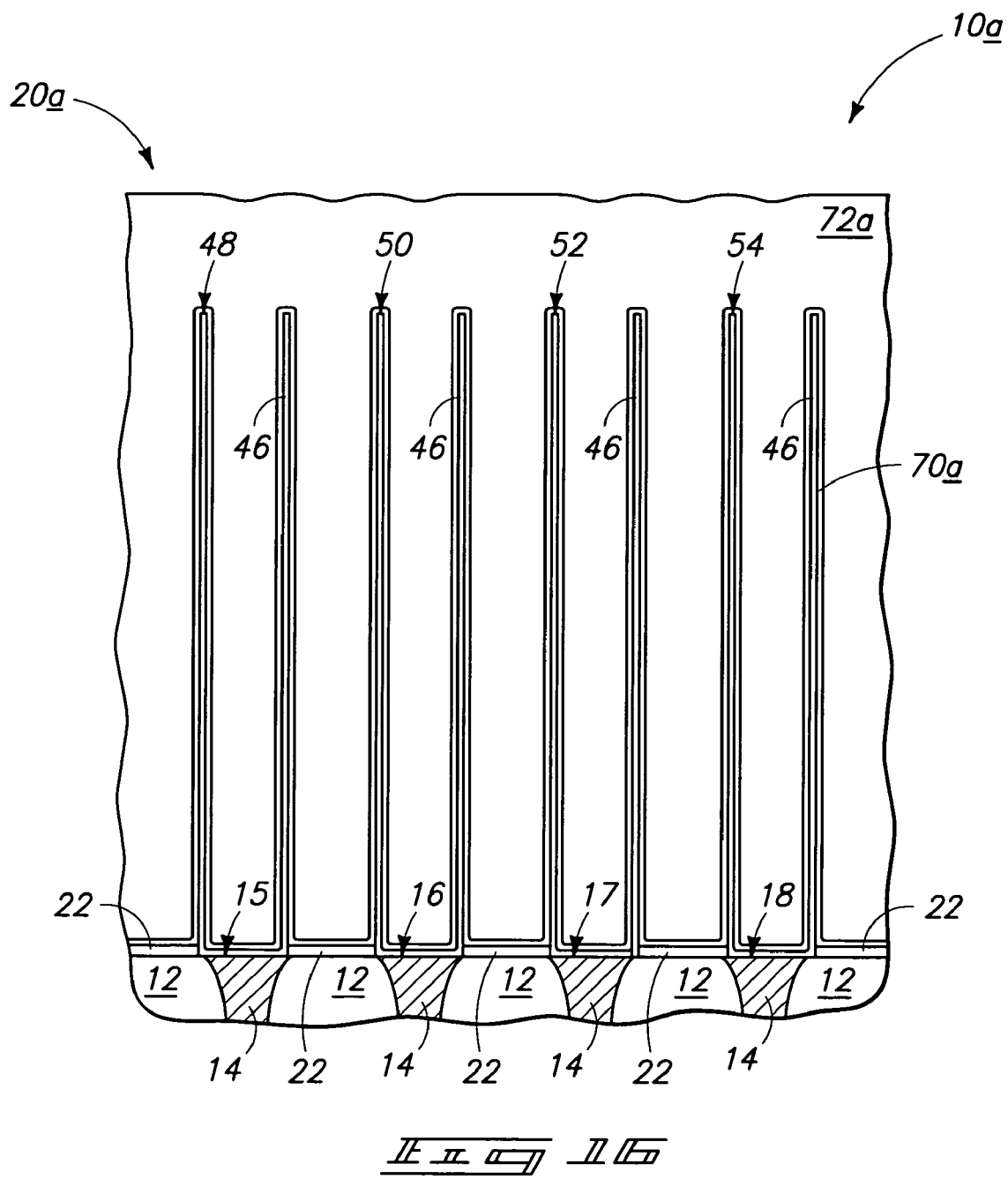
FIG. 16 is a view of the FIG. 15 substrate at a processing step subsequent to that shown by FIG. 15.

The above-described embodiments depict at least some of masking layer 26 remaining as part of the finished circuitry construction. By way of example only with respect to a substrate 10a, an alternate exemplary embodiment is depicted in FIGS. 15 and 16 whereby all of patterned masking layer 26 (not shown) is ultimately removed from the substrate. Like numerals from the first-described embodiment have been utilized where appropriate, with differences being indicated with the suffix "a". FIG. 15 depicts exemplary preferred processing as might occur subsequent to the FIG. 9 depiction. For example, FIG. 15 depicts the removal of all of masking layer 26 (not shown), followed by the removal of at least some, and all as shown, of metal oxide 40 (not shown). FIG. 16 depicts the subsequent deposition of capacitor dielectric layer 70a, and an outer capacitor electrode layer 72a.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a plurality of capacitors, comprising:
   anodically etching a material over individual capacitor storage node locations on a substrate to form individual capacitor electrode channels within the material;
   at least partially filling the channels with electrically conductive capacitor electrode material in electrical connection with the individual capacitor storage node locations; and
   incorporating the capacitor electrode material into a plurality of capacitors.

2. The method of claim 1 wherein the material comprises metal.

3. The method of claim 1 comprising only partially filling said channels with capacitor electrode material.

4. The method of claim 1 wherein the anodic etching forms the channels to extend to and expose the individual capacitor storage node locations.

5. The method of claim 1 wherein the anodic etching does not form the channels to extend to and expose the individual capacitor storage node locations; and etching material from over the individual capacitor storage node locations prior to said at least partial filling with capacitor electrode material.

6. The method of claim 1 wherein individual of the capacitor electrodes comprises a container shape.

7. A method of forming a plurality of capacitors, comprising:
   forming metal over individual capacitor storage node locations on a substrate;
   forming a patterned masking layer over the metal, the patterned masking layer comprising openings therethrough to the metal, individual of the openings being received over individual of the capacitor storage node locations;
   anodically etching the metal through the openings effective to form a single metal oxide-lined channel in individual of the openings over the individual capacitor storage nodes;
   forming individual capacitor electrodes within the channels in electrical connection with the individual capacitor storage node locations; and
   removing at least some of the metal oxide from the substrate and incorporating the individual capacitor electrodes into a plurality of capacitors.

8. A method of forming a plurality of capacitors, comprising:
   forming metal comprising aluminum over individual capacitor storage node locations on a substrate;
   forming a patterned masking layer over the metal, the patterned masking layer comprising openings therethrough to the metal, individual of the openings being received over individual of the capacitor storage node locations;
   anodically etching the metal through the openings effective to form a single metal oxide-lined channel in individual of the openings over the individual capacitor storage nodes, the metal oxide comprising aluminum oxide;
   forming individual capacitor electrodes within the channels in electrical connection with the individual capacitor storage node locations; and
   removing at least some of the metal oxide from the substrate and incorporating the individual capacitor electrodes into a plurality of capacitors.

9. The method of claim 7 wherein the metal comprises at least one of Ti, Ta, Nb, Zr, W, V, Hf, B, and Bi.

10. The method of claim 7 wherein forming the patterned masking layer comprises lithography and etch.

11. The method of claim 7 wherein the patterned masking layer is electrically insulative.

12. The method of claim 11 wherein at least some material of the patterned masking layer remains as part of finished circuitry construction incorporating the plurality of capacitors, said incorporating comprising depositing a capacitor dielectric layer and an outer capacitor electrode layer over said material.

13. The method of claim 7 comprising after the anodic etching, removing at least some of the patterned masking layer from the substrate.

14. The method of claim 13 wherein said removing of at least some of the patterned masking layer is of only some of the patterned masking layer.

15. The method of claim 13 wherein said removing of at least some of the patterned masking layer occurs after forming the individual capacitor electrodes.

16. The method of claim 15 wherein said removing of at least some of the patterned masking layer is of only some of the patterned masking layer.

17. The method of claim 13 wherein said removing of at least some of the patterned masking layer is of all of the patterned masking layer.

18. The method of claim 7 wherein forming the individual capacitor electrodes comprises deposition of an electrically conductive layer and polishing said conductive layer back at least to the patterned masking layer.

19. The method of claim 7 wherein the anodic etching forms the channels to extend to and expose the individual capacitor storage node locations.

20. The method of claim 7 wherein the anodic etching does not form the channels to extend to and expose the individual capacitor storage node locations, and wherein forming the individual capacitor electrodes comprises depositing an electrically conductive layer; and
etching material from over the individual capacitor storage node locations prior to depositing said conductive layer.

21. A method of forming a plurality of capacitors, comprising:
forming metal over individual capacitor storage node locations on a substrate;
forming a patterned masking layer over the metal, the patterned masking layer comprising openings therethrough to the metal, individual of the openings being received over individual of the capacitor storage node locations;
anodically etching the metal through the openings effective to form a single metal oxide-lined channel in individual of the openings over the individual capacitor storage nodes, the anodic etching oxidizing all said metal to metal oxide;
forming individual capacitor electrodes within the channels in electrical connection with the individual capacitor storage node locations; and
removing at least some of the metal oxide from the substrate and incorporating the individual capacitor electrodes into a plurality of capacitors.

22. The method of claim 7 wherein individual of the capacitor electrodes comprises a container shape.

23. A method of forming a plurality of capacitors, comprising:
forming metal over individual capacitor storage node locations on a substrate;
forming a patterned masking layer over the metal, the patterned masking layer comprising openings therethrough to the metal, individual of the openings being received over individual of the capacitor storage node locations;
anodically etching the metal through the openings effective to form a single metal oxide-lined channel in individual of the openings over the individual capacitor storage nodes;
forming individual capacitor electrodes within the channels in electrical connection with the individual capacitor storage node locations; and
removing all said metal oxide from the substrate and incorporating the individual capacitor electrodes into a plurality of capacitors.

24. The method of claim 7 wherein said removing is of only some of said metal oxide.

25. The method of claim 7 wherein said anodic etching forms the individual channels to correspond to the same cross sectional size and shape of the individual openings in the masking layer.

26. The method of claim 7 wherein said anodic etching forms the individual channels to correspond to a cross sectional size which is smaller than that of the individual openings in the masking layer.

27. The method of claim 26 further comprising isotropically etching the channels after the anodic etching and before forming the individual capacitor electrodes effective to widen the channels.

28. A method of forming a plurality of capacitors, comprising:
forming metal over individual capacitor storage node locations on a substrate;
forming a patterned masking layer over the metal, the patterned masking layer comprising openings therethrough to the metal, individual of the openings being received over individual of the capacitor storage node locations;
anodically etching the metal through the openings effective to form a single metal oxide-lined channel in individual of the openings over the individual capacitor storage nodes;
forming individual capacitor electrodes within the channels in electrical connection with the individual capacitor storage node locations;
after forming the individual capacitor electrodes, forming access openings within the patterned masking layer to the metal oxide;
etching at least some of the metal oxide from the substrate through the access openings; and
after etching the metal oxide, incorporating the individual capacitor electrodes into a plurality of capacitors.

29. A method of forming a plurality of capacitors, comprising:
forming metal over individual capacitor storage node locations on a substrate;
depositing an electrically insulative masking layer over the metal;
lithographically patterning and etching the masking layer effective to form openings therethrough to the metal, individual of the openings being received over individual of the capacitor storage node locations;
anodically etching the metal through the openings effective to form a single metal oxide-lined channel in individual of the openings over the individual capacitor storage nodes;
depositing an electrically conductive layer over the patterned masking layer and to within the channels effective to line the channels with said electrically conductive layer;
polishing the electrically conductive layer back at least to the patterned masking layer effective to form individual container-shaped capacitor electrodes within the channels in electrical connection with the individual capacitor storage node locations;
after forming the container-shaped capacitor electrodes, lithographically patterning and etching the masking layer effective to form access openings within the masking layer to the metal oxide;
etching at least some of the metal oxide from the substrate through the access openings;
after etching the metal oxide, depositing a capacitor dielectric layer over the masking layer and over the container-shaped electrodes; and
after depositing the capacitor dielectric layer, depositing an outer capacitor electrode layer over the capacitor dielectric layer.

30. A method of forming a plurality of capacitors, comprising:
   anodically etching a material over individual capacitor storage node locations on a substrate to form individual capacitor electrode channels within the material;
   at least partially filling the channels with electrically conductive capacitor electrode material in electrical connection with the individual capacitor storage node locations; and
   after the anodically etching and after the at least partially filling the channels with electrically conductive material, etching at least some of the material within which the capacitor electrode channels are formed from the substrate; and
   incorporating the capacitor electrode material into a plurality of capacitors.

31. The method of claim 30 comprising etching only some of the material within which the capacitor electrode channels are formed from the substrate.

32. The method of claim 30 comprising etching all of the material within which the capacitor electrode channels are formed from the substrate.

33. A method of forming a plurality of capacitors, comprising:
   anodically etching a metal material comprising aluminum over individual capacitor storage node locations on a substrate to form individual capacitor electrode channels within the material;
   at least partially filling the channels with electrically conductive capacitor electrode material in electrical connection with the individual capacitor storage node locations; and
   incorporating the capacitor electrode material into a plurality of capacitors.

34. The method of claim 2 wherein the metal comprises at least one of Ti, Ta, Nb, Zr, W, V, Hf, B, and Bi.

35. The method of claim 2 wherein the anodic etching forms individual of the channels to be hexagonal in cross sectional shape.

36. The method of claim 26 wherein the anodic etching forms individual of the individual channels to have a cross shape which is different from that of the individual openings in the masking layer, the individual channels being hexagonal in cross sectional shape.

37. The method of claim 28 wherein the anodic etching forms individual of the channels to be hexagonal in cross sectional shape.

38. The method of claim 29 wherein the anodic etching forms individual of the channels to be hexagonal in cross sectional shape.

39. The method of claim 28 wherein the metal comprises aluminum, and the metal oxide comprises aluminum oxide.

40. The method of claim 28 wherein the metal comprises at least one of Ti, Ta, Nb, Zr, W, V, Hf, B, and Bi.

41. The method of claim 29 wherein the metal comprises aluminum, and the metal oxide comprises aluminum oxide.

42. The method of claim 29 wherein the metal comprises at least one of Ti, Ta, Nb, Zr, W, V, Hf, B, and Bi.

43. The method of claim 1 wherein the anodically etching comprises using an acid comprising one or more of oxalic acid, chromic acid, sulfuric acid, phosphorus acid and boric acid.

* * * * *